United States Patent
Voegeli

Patent Number: 5,100,220
Date of Patent: Mar. 31, 1992

[54] SEMICONDUCTOR LASER DIODE ARRANGEMENT AND METHOD OF MAKING SAME

[75] Inventor: Otto Voegeli, Morgan Hill, Calif.

[73] Assignee: International Business Machines Corporation, Armonk, N.Y.

[21] Appl. No.: 594,254

[22] Filed: Oct. 9, 1990

[30] Foreign Application Priority Data

Mar. 8, 1990 [EP] European Pat. Off. ............ 90810179

[51] Int. Cl.$^5$ ..................... G02B 6/32; B44C 1/22; H01S 3/08; H01L 21/70

[52] U.S. Cl. ........................... 385/14; 385/33; 385/132; 156/643; 372/99; 437/20; 437/27; 437/51

[58] Field of Search ............... 350/96.11, 96.12, 96.15, 350/96.17, 96.18, 96.19, 320; 437/51, 20, 27, 36, 38, 147, 150; 156/643; 372/48, 49, 99; 357/17, 19, 45

[56] References Cited

U.S. PATENT DOCUMENTS

| | | | |
|---|---|---|---|
| 3,996,492 | 12/1976 | McGroddy | 372/93 |
| 3,996,528 | 12/1976 | Blum et al. | 372/93 X |
| 4,069,463 | 1/1978 | McGroddy et al. | 372/50 X |
| 4,732,446 | 3/1988 | Gipson et al. | 350/96.15 |
| 4,744,615 | 5/1988 | Fan et al. | 350/96.18 X |
| 4,757,513 | 7/1988 | Fukae | 372/99 |
| 4,817,109 | 3/1989 | Miyauchi et al. | 372/99 X |
| 4,871,224 | 10/1989 | Karstensen et al. | 350/96.15 |
| 4,933,262 | 6/1990 | Beguin | 350/96.11 X |
| 4,935,939 | 6/1990 | Liau et al. | 372/98 |
| 4,945,400 | 7/1990 | Blonder et al. | 350/96.15 |
| 4,956,844 | 9/1990 | Goodhue et al. | 372/99 X |
| 4,981,334 | 1/1991 | Sniadower | 350/96.15 |
| 5,001,719 | 3/1991 | Trussell | 372/99 X |

Primary Examiner—Brian Healy
Attorney, Agent, or Firm—Donald M. Boles

[57] ABSTRACT

A semiconductor device, formed on a wafer, comprises an array of laser diodes, each emitting a beam parallel to the wafer surface and, integrated with the array, individually tilted deflecting mirrors forming an array of virtual sources. The virtual sources are spaced more closely together than the physical separation of the laser diodes and can even be coincident, thereby reducing the apparent spacing between the beam origins. The reflected beams are substantially perpendicular to the wafer providing a "surface-emitting" device. The required deflector configuration can be fabricated using a single unidirectional process, the mirror positions and orientations being determined by proper segment geometry of the etch-mask.

13 Claims, 3 Drawing Sheets

SEMICONDUCTOR LASER DIODE ARRANGEMENT AND METHOD OF MAKING SAME

TECHNICAL FIELD

The invention refers to a laser diode arrangement that includes an epitaxial layer in which an array of laser diodes and a plurality of integrated reflectors are formed, one for each beam emitted by the array. The reflectors create an array of virtual sources with lateral distances therebetween that differ from the physical spacing of the laser diodes. More particularly, the virtual sources are more closely spaced together than laser diodes and can even be concentrated on one spot. A single lens can be used to project this array of virtual sources.

BACKGROUND OF THE INVENTION

Semiconductor laser diodes have found applications in a wide variety of information handling systems because of their compact size and because their technology is compatible with that of associated electronic circuitry and other electro-optical elements such as mirrors. They are used, among others, in data communication, optical storage and optical beam printing.

Efforts aiming at improved performance in applications requiring more than one light source have led to the design of integrated laser arrays capable of emitting a plurality of closely spaced laser beams. In general, they are used to replace slower serial operations by faster parallel processing, e.g., byte-processing instead of bit-by-bit processing, or in document scanning and printing.

A wide variety of laser array structures have been described, some of which are listed herein below:

"Experimental and Analytic Studies of Coupled Multiple Stripe Diode Lasers" by D. R. Scifres et al. (IEEE Journal of Quantum Electronics, Vol. QE-15, No. 9, September 1979, pages 917-922).

U.S. Pat. No. 4,069,463 "Injection Laser Array" (issued January 1978).

European Patent Application 0 226 445, "Laser Array" (published June 24, 1987).

European Patent Application 0 301 818, "Semiconductor Laser Array Device" (published Feb. 1, 1989).

European Patent Application 0 301 846, "Semiconductor Laser Array Apparatus" (published Feb. 1, 1989).

In spite of substantial progress made in recent years to develop a process to minimize device dimensions, further reduction in the spacing between individual beams is still highly desirable for high resolution applications. One approach consists of using optical systems to bring laser beams closer together. However, the use of individual lens systems for each beam makes such arrangement highly complex and prohibitively expensive. In addition, devices that require dimensions on the order of microns have seen their optical systems attain their physical limits. The laser arrangement described hereinbelow points to a new direction.

In addition to efforts aimed at achieving closely spaced beams, new developments have mainly focused on designs of surface emitting lasers. Therein, beams emitted in a plane parallel to the wafer surface on which the laser structure is epitaxially grown are reflected at an integrated mirror to exit the device in a direction perpendicular to the wafer surface. Such arrangements have been disclosed in the following references:

U.S. Pat. No. 3,996,492, "Two-Dimensional Integrated Injection Laser Array" (issued Dec. 7, 1976).

U.S. Pat. No. 3,996,528, "Folded Cavity Injection Laser" (issued Dec. 7, 1976).

U.S. Pat. Application 264,422, "Integrated Laser Arrays and Support Circuits" (filed Oct. 31, 1988).

IBM Technical Disclosure Bulletin, "Vertically Emitting Laser with Integrated NAM Deflector" (Vol. 32, No. 3B, August 1989, pages 498-499).

Another approach to obtain surface emitting laser diodes is described in an article "Surface Emitting Laser Diode with Bent Waveguide", by M. Ogura et al. (Appl. Phys. Lett. 50(12), Mar. 23, 1987, pages 705-707). There, a bent double heterostructure fabricated on a grooved substrate is used instead of a deflecting mirror.

However, no suggestion has been made to using optical elements that achieve the desired "surface emitting" by providing virtual sources spaced more closely together than the corresponding beam sources which can be projected by simple optical means.

With regard to the optical principle on which the present laser diode arrangement is based, similarities exist with the so-called "Fresnel's mirror" arrangement wherein light from a point source is incident on two plane mirrors mutually inclined at a small angle. Reflection at the mirrors gives raise to two virtual images. A description can be found in the handbook "Principles of Optics", Max Born & Emil Wolf, Pergamon Press, 6th Edition, page 262. This reference, however, does not in any way suggest any potential technical application of the described optical principle.

SUMMARY OF THE INVENTION

It is an object of the present invention to provide a laser diode arrangement in which a plurality of laser beam sources is transferred to a contracted or even a coincident collection of virtual sources that can be projected to the desired processing plane by simple optical means.

Another object is to provide a "surface emitting" integrated laser array structure from which the emitted laser beams exit in a direction perpendicular to the surface of the wafer upon which the structure is formed.

A further object is to provide a method to allow the fabrication of the proposed surface emitting, reduced-beam-separation-laser-diode arrangement using a conventional unidirectional process in connection with proper masking segment geometries.

In the present invention, these objects are achieved by providing an individually oriented and positioned reflector to each laser beam emitted by the laser array. These reflectors produce an array of virtual sources such that the distance between these virtual sources differs from the distance between corresponding beams (or real sources). The array of virtual sources is then projected into a desired plane using a single lens. Most significant yet are embodiments in which the virtual sources are brought closer together or made to coincide.

The group of reflectors, one for each beam that dry-etch process using a mask whose segments (together with the common angle of the directional etch) properly determine the individual positions and the orientations of the tilted reflecting surfaces.

A main advantage of the present invention is that the proposed structure serves as a device that transfers a plurality of laser beam sources into closer spaced, contracted, laser sources. A few examples of applications where the inventive laser diode arrangement may be advantageously used are:

Band-recording when spacing between tracks is smaller than the smallest obtainable spacing between adjacent lasers of the laser array. Contracted virtual sources allow parallel recording on adjacent tracks.

Gradual laser degradation as a function of laser power. It can be reduced by operating several lasers with coincident virtual sources at a fraction of the power.

Laser reliability may be greatly improved through redundancy. This can be achieved by coincident virtual sources, used sequentially or in combination.

Power density in an imaged spot obtainable with a single laser diode is limited by catastrophic failure of the laser mirrors. This limit can be raised when using coincident virtual sources.

Short coherence length is important in communication applications; this length can be shortened by combining the outputs of coincident virtual sources.

BRIEF DESCRIPTION OF THE DRAWINGS

Other objects, features and advantages of the present invention will become more fully apparent from the detailed description of the preferred embodiments, the appended claims and accompanying drawings in which:

FIG. 4 (A, B, C & D) shows simplified schematic diagrams of the top and side views of various reflector arrangements.

DETAILED DESCRIPTION

Before describing a preferred embodiment of the inventive laser diode array in greater detail, the tilted reflector concept applied to the structure for be outlined.

Figure 1:
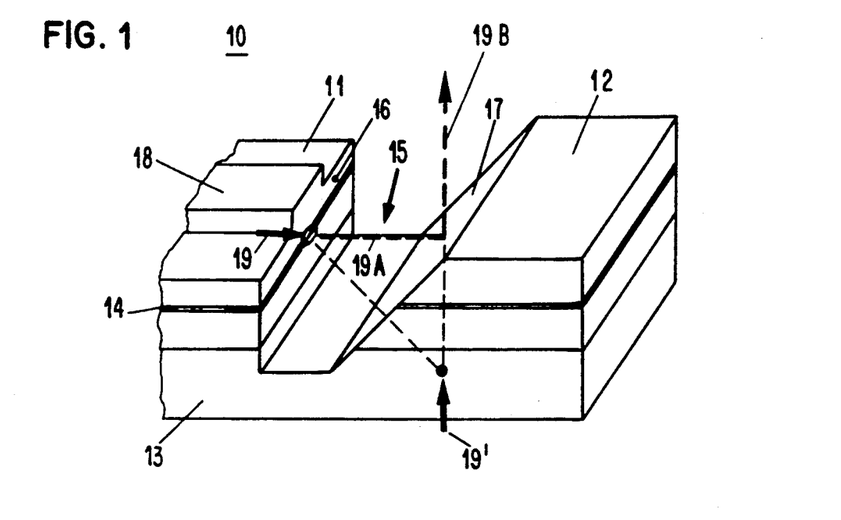
FIG. 1 shows a schematic view of a state of the art integrated "surface emitting" laser diode/reflector structure.

FIG. 1 is a perspective view of a known surface emitting laser structure 10, of which only the main elements are shown. These are: the laser diode 11 and the integrated 45° reflector 12. Both are formed in a stack of epitaxially grown layers formed on a GaAs substrate 13, the stack including at least an active layer 14 sandwiched between cladding layers. For the sake of simplicity, only the active layer is shown. FIG. 1 shows the structure after etching the groove 15 that provides the laser mirror facet 16 and the 45° reflecting surface 17. Omitted from the drawing are the metallization layers providing electrical contacts to the completed device.

When the device is activated by applying the proper operating voltages, a light beam 19A is emitted. The light mode region of the laser is shown as a small ellipse centered around the active layer 14 and laterally defined by stripe ridge 18. Arrow 19 represents the "real" source of the emitted beam 19A which impinges onto the 45° surface 17. Here it is deflected, thus making the "surface emitting" laser (i.e., the output beam 19B) perpendicular to the substrate surface. Beam 19B can be considered as emitted without deflection from a virtual source 19'.

The purpose of the present invention is to apply the concept of a tilted reflector to an array of integrated lasers and to simultaneously reduce the separation between the individual lasers of the array to an apparent (or virtual) smaller spacing. This allows meeting the demand for multiple beam sources with spacings between the sources smaller than the smallest separation at which lasers can be fabricated and operated. The invention allows transforming a collection of real sources into a contracted or even coincident collection of virtual sources which can then be projected, using a single lens, to provide the required reduced-scale light pattern.

Figure 2:
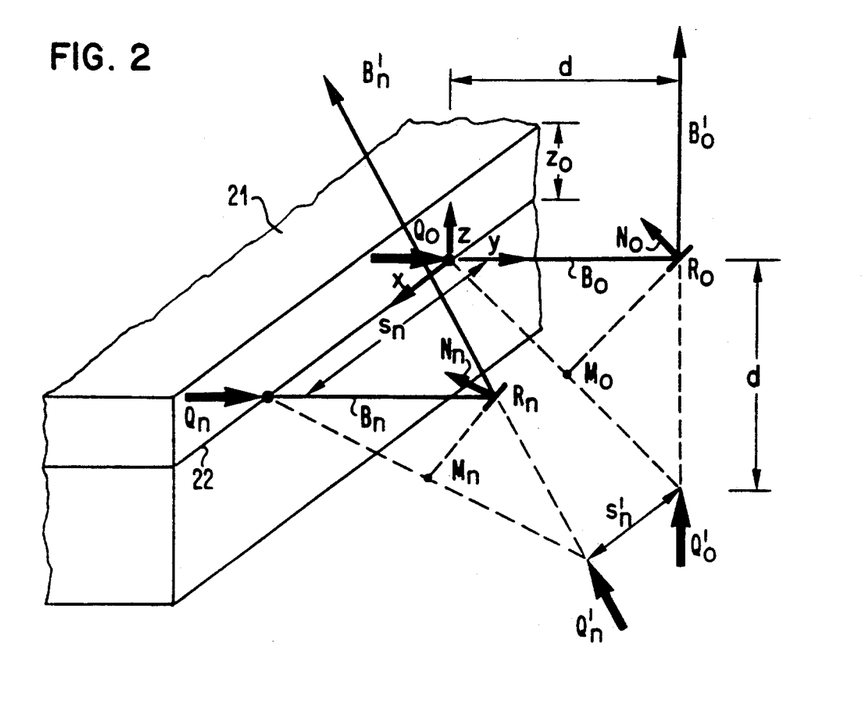
FIG. 2 is a schematic illustration of the main elements of the inventive diode laser arrangement (used to explain the underlying concept)

The principle will now be described with reference to FIGS. 2 and 3. FIG. 2 illustrates a laser array structure 21 (similar to laser 11 of FIG. 1), with two light sources $Q_o$ and $Q_n$, emitting beams $B_o$ and $B_n$, respectively. These "real" sources are formed by waveguides along the y-direction, with the front mirror facets being in the x-z plane. It is, however, noted that, conceptually, the front mirrors do not have to be co-planar. Beam $B_o$, proceeding in the y-z plane, is reflected at reflector $R_o$ and projected upward. The reflector surface is tilted 45°, its "normal" (perpendicular to the reflecting surface) is shown as arrow $N_o$, and the virtual source $Q_o'$ of the beam in the position shown in the drawing. The second source $Q_n$ representing other sources in the array emits a beam $B_n$ from the array at a point that is separated from $Q_o$ by a distance $s_n$. Its beam $B_n$ is intersected by the reflector $R_n$.

The position of the respective virtual source $Q_n'$ is determined by the orientation and position of the reflector $R_n$. As previously explained, the goal is to achieve a virtual source $Q_n'$ at a distance $s_n'$ from $Q_o'$ that is different from the separation $s_n$ of the respective real sources $Q_o$ and $Q_n$. In the extreme case, when $s_n'=0$, i.e., the virtual sources coincide and the respective real sources that are separated are projected onto a single spot.

The requirements and conditions for proper orientation and positioning of a reflector $R_n$ are as described below. The real ($Q_o$) and the virtual ($Q_o'$) sources of the beam $B_o$ lie in the y-z plane. If the exit beam $B_o'$ is to be perpendicular to the plane of active layer 22 of the laser diode array or to the wafer surface, (i.e., to the x-y plane), $R_o$ must remain parallel to the x-axis and tilted by 45°. It is then placed at a distance d (determined by the far/near field beam pattern and other technology considerations) from the front mirror plane of the array. Thus, the virtual source $Q_o'$ lies in the y-z plane, namely, at the x,y,z-coordinates: (0,d,−d).

As can be seen from FIG. 2, the reflector $R_o$ is oriented with respect to its normal $N_o$ parallel to the line $Q_oQ_o'$ connecting $Q_o$ and $Q_o'$ and it is, furthermore, positioned with the reflector plane passing through the midpoint $M_o$ of this connecting line. These rules do not only apply to source $Q_o$ or to its associated reflector $R_o$ and resulting virtual source $Q_o'$ but to all other sources in the same laser array, (such as $Q_n$, reflectors $R_n$ and virtual sources $Q_n'$. As will become apparent hereinafter, in many situations it is desirable and even necessary that all virtual sources ($Q_o',Q_n'$ and others) be lined-up in the x-direction. Thus, another condition for positioning a virtual source $Q_n'$ emerges: it needs to be formed at the coordinates $(s_n', d, -d)$, with $s_n'$ determined by the separation reduction factor $s_n'/s_n$ that is to be achieved. Therefore, if $Q_n$ is at the coordinate $(s_n, 0, 0)$, to obtain the virtual source $Q_n'$ at the coordinate $(s_n', d, -d)$, the reflector $R_n$ requires an orientation such that its normal $N_n$ is parallel to the connecting line $Q_nQ_n'$. Furthermore, the reflector $R_n$ has to be positioned to bisect the connecting line at its midpoint $M_n$. The direction of the reflected beam $B_n'$ is generally upward but, as illustrated in FIG. 2, it is tilted from the normal to the x-y plane (or the wafer surface).

The upwardly reflected beams $B_o'$ and $B_n'$ issued from virtual sources $Q_o'$, $Q_n'$, etc., can then be collected by a single lens (not shown) that provides, a reduced-scale projection of the virtual source pattern $Q_o'$, $Q_n'$ on a predetermined plane. When the reflectors $R_o$, $R_n$, ... , are oriented and positioned to combine all virtual sources on one point $(s_n'=0)$, it is a lens that will provide a projection of the virtual sources at one point where light energy is added. It should be noted that virtual sources do not necessarily have to be positioned on a straight line. For some applications, arcs are preferable since they either compensate for lens aberration or allow the use of simpler lenses. Such configurations of virtual sources can be obtained by properly adjusting the y-positions of the lasers and/or the reflectors.

Next will be illustrated how the inventive structure can be fabricated. Reference is made to 2. It comprises two real sources $Q_o$ and $Q_n$, emitting beams $B_o$ and $B_n$ from waveguides formed surrounding active layer 22 in the array 21, and the respective reflectors $R_o$ and $R_n$. The array structure 21 can be produced and designed using conventional laser diode techniques and, as will be shown hereinafter, the reflectors $R_o$ and $R_n$ even though they are differently oriented and positioned can also be fabricated with a standard process.

Two adjustable parameters are available in conventional fabrication methods: the direction of processing (as illustrated by the angle of incidence in directional dry-etching processes), and the processing boundary (as determined by a mask pattern defined lithographically).

Figure 3:
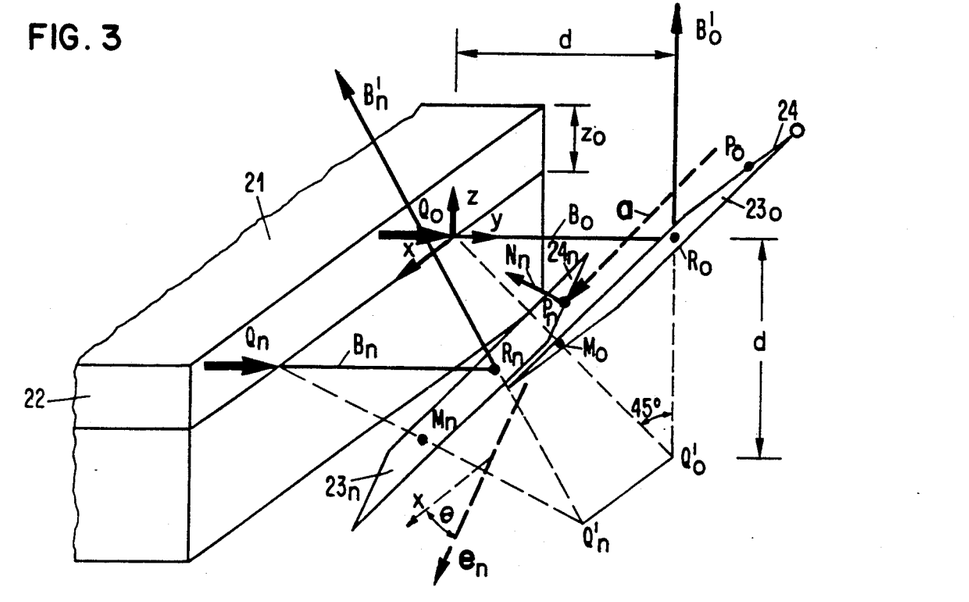
FIG. 3 is a schematic of the principle of operation of the laser array/reflector arrangement and the key process parameters for the fabrication of individual reflectors.

In FIG. 3, beams $B_o$ and $B_n$ from real sources $Q_o$ and $Q_n$ strike the tilted reflector surfaces $23_o$ and $23_n$ at points $R_o$ and $R_n$ from where beams $B_o'$ and $B_n'$ are reflected in a generally upward direction. In the drawing, the beam axis are shown as being reflected at the center points $R_o$ and $R_n$ of the tilted plane surfaces represented by parallelograms $23_o$ and $23_n$. The beam divergence requires a finite surface area instead of just the reflecting points $R_0$ and $R_n$. For simplicity sake, only the beam axis are shown in the drawings.

Since it is desired to produce reflecting surfaces $23_o$ and $23_n$ in a single process, the tilt angle with respect to the x-z plane of all reflectors is determined by the processing vector a, e.g., the etchdirection in the directional etch process. In FIG. 3, a tilt angle of $45°$ has been assumed. The reflecting surfaces $23_o$ and $23_n$ are also defined by their respective mask edges $24_o$ and $24_n$ residing in the same plane as the top surface of array 21, i.e., in the x-y plane at $z=z_o$ ($z_o$ being the thickness of the layers above active layer 22).

Following is a general consideration applicable to reflecting surface $23_n$ and to its beam-axis reflecting point $R_n$. Surface $23_n$ is determined by the processing vector a ($45°$ as noted above) and by the masking edge $24_n$ which, in turn, is determined by vector $e_n = (\cos\theta_n, \sin\theta_n, 0)$, $\theta$ being the orientation of the azimuth with respect to the x-direction. Vectors a and $e_n$ determine the orientation and the position of plane $23_n$ and thus the plane normal $N_n = a \times e_n$.

The rules that have been developed in connection with FIG. 2 require that:
the normal $N_n$ of the reflector $23_n$ be parallel to line $Q_nQ_n'$, and
the reflector surface $23_n$ pass through the mid-point $M_n$ of line $Q_nQ_n'$.

Applying these rules, one obtains the equations:

$$R_n = a \times e_n - Q_nQ_n' \qquad (\text{eq. 1})$$

and for the $M_n$ coordinates:

$$M_n = \left( \frac{s_n + s_n'}{2}, \frac{d}{2} - \frac{d}{2} \right) \qquad (\text{eq. 2})$$

For the selected $45°$ etch direction $a=(0, -1, -1)$:

$$a \times e_n = (0, -1, -1) \times (\cos\theta_n, \sin\theta_n, 0)$$
$$= (\sin\theta_n, -\cos\theta_n, \cos\theta_n)$$

With this, equation (1) is reduced to:

$$(\sin\theta_n, -\cos\theta_n, \cos\theta_n) = Q_nQ_n'$$
$$= (s_n, 0, 0) - (s_n^1, d, -d)$$
$$= ((s_n - s_n'), -d, d)$$

From this equation one obtains:

$$\tan\theta_n = \frac{s_n - s_n'}{d} \qquad (\text{eq. 3})$$

$\theta_n$ defines the orientation of the mask edge $24_n$ whereas the position of this edge is defined by the mid-point $P_n$ of the edge having coordinates $$P_n - \frac{(s_n + s_n', d + z_o, z_o)}{2}$$

It follows that for the assumed processing vector a (with a processing angle in the y-z plane of $45°$) the y-coordinate of all reflection points $R_n$ equals d, i.e., for an array 21 with front mirrors in the x-y plane, the distance between the mirror facet and the reflection points equals d for all beams.

FIG. 4 illustrates how reflecting surfaces $23_n$ can be positioned with respect to a number of real sources such that $Q_nR_n = d$.

Figure 4A:
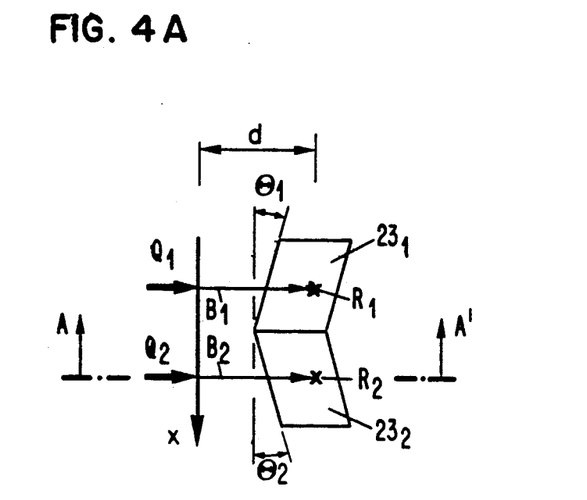

FIG. 4A is a top-view of the arrangement chosen for the embodiment of the invention. Two beams, $B_1$ and $B_2$, emitted from sources $Q_1$ and $Q_2$, strike the associated reflector surfaces $23_1$ and $23_2$ at $R_1$ and $R_2$, respectively. The reflector surfaces form angles $\theta_1$ and $\theta_2$ with the x-axis. The respective side-view, (FIG. 4D) representing a cross-section A—A' through the arrangement, is shown to ease understanding.

Figure 4B:
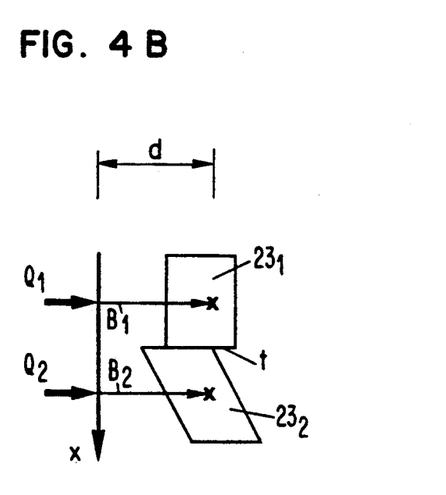

FIG. 4B represents another two-beam embodiment. In contrast with the arrangement of FIG. 4A, one of the reflecting surfaces (struck by beam B1) is oriented parallel to the x-axis. As a consequence, a "step" t between the two reflector surfaces $23_1$ and $23_2$ is required to meet the condition $Q_nR_n = d$.

Figure 4C:
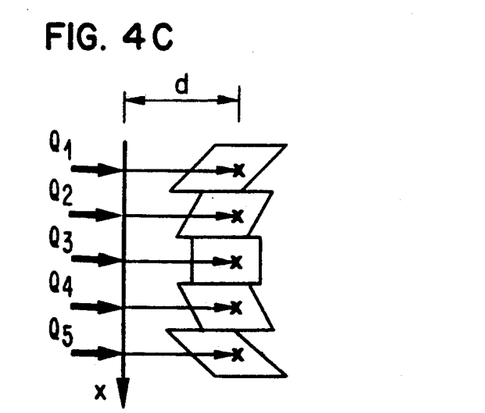
Figure 4D:
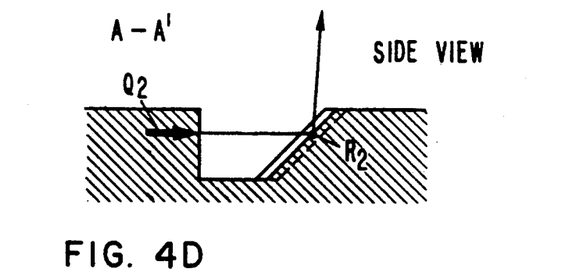

FIG. 4C illustrates a five-beam array, each beam with its associated reflecting surface. Again, additional steps are required between neighboring reflecting surfaces.

Figure 5:
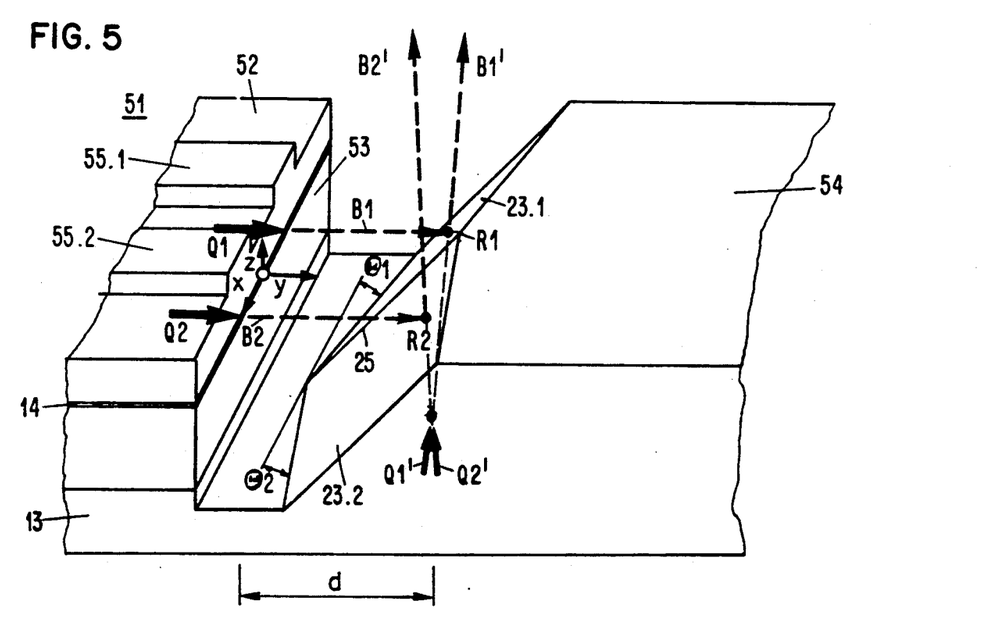
FIG. 5 is a perspective view of the embodiment of an integrated laser array/reflector arrangement designed in accordance with the present invention.

FIG. 5 is an illustration of the embodiment of a laser diode arrangement 51 designed in accordance with the present invention. The structure comprises a laser array 52 that emits beams $B_1$ and $B_2$ from sources $Q_1$ and $Q_2$, respectively. The arrangement 51 corresponds to the structures considered in connection with FIGS. 2, 3, 4A and 4D. The reflecting surfaces 23.1 and 23.2 are oriented as in FIGS. 4A and 4D, i.e., both surfaces form angles ($\theta 1$ and $\theta 2$) with the x-axis, the tilted reflecting surfaces intersecting at x=0. With this configuration, no steps are required as in the embodiments shown by FIGS. 4B and 4C to meet the condition:

$$Q1R1 = Q2R2 = d$$

When applying proper operating voltages, the laser 52 emits beams B1 and B2; they strike the respective reflecting surfaces 23.1 and 23.2 at points R1 and R2. Reflected beams B1' and B2' exit the arrangement in an upward direction with their axes symmetrically tilted from the wafer normal since the surfaces 23.1 and 23.2 form angles $\theta 1$ and $\theta 2$ with the x-axis.

A collecting lens (not shown in the drawing), placed above the arrangement, is used to project the virtual sources Q1' and Q2' onto a desired processing plane. If the angles $\theta 1$ and $\theta 2$ are chosen as in FIG. 5, virtual sources Q1' and Q2' will be projected onto a single point. This is obtained when $s_n' = 0$, where equation (3) is reduced to:

$$\tan \theta 1 = \tan \theta 2 = \frac{S_n}{d} \quad \text{(eq. 4)}$$

Next, the fabrication process for the laser diode structure of FIG. 5 will be outlined.

The multi-layer stack grown epitaxially forms the base for the laser array 52. The reflector 54 can be the same and fabricated with the same process as described in the article by C. Harder et al., "High-Power Ridge-Waveguide AlGaAs GRINSCH Laser diode" (published in Electronics Letters, Sept. 25, 1986, Vol. 22, No. 20, pages 1081-1082). The sequence of steps for producing the stack of layers (not all of them shown in FIG. 5) is as follows:

The layers are grown on an n+ -doped GaAs substrate 13 by, e.g., molecular beam epitaxy (MBE). First, an n-doped GaAs buffer layer is grown on the substrate. Next is a lower, n-type cladding layer ($Al_{0.45}Ga_{p.55}As$). The core of the laser consists of a graded n-type region (0.2 $\mu m$ $Al_{0.45}Ga_{0.55}As$ graded towards $Al_{0.18}Ga_{0.82}As$), an undoped active region 14 forming a quantum well (7 nm GaAs), and a graded p-type region (0.2 $\mu m$ $Al_{0.18}Ga_{0.82}As$ graded towards $Al_{0.45}Ga_{0.55}As$). Next is the top p-type cladding layer ($Al_{0.45}Ga_{0.55}As$), followed by a p+GaAs contact layer with a doping density high enough for a titanium-platinum-gold electrode to make ohmic contact. Another ohmic contact, at the bottom side of the n-type substrate 13, is obtained by alloying germanium, gold and nickel. In the present embodiment, ridges 55.1 and 55.2, are approximately $4\mu$ wide and 20 $\mu m$ apart and provide the lateral waveguiding to the two waveguides serving as real sources $Q_1$ and $Q_2$. The ridges are formed on top of the structure prior to depositing the metal contact electrodes by first applying a photoresist mask to define the ridges, followed by etching 1 and 2 $\mu m$ of the exposed top layers, letting the etching stop at 0.2 $\mu m$ above the graded-index part of the top cladding layer. This is followed by depositing 100 nm $SiO_2$, subsequent lift-off, and removing the $SiO_2$ from the ridges.

The groove is composed of a sidewall that serves as the laser mirror facet 53, of a second sidewall that provides the deflecting surfaces 23.1 and 23.2 at the reflector structure 54. These are etched using a mask and an etching method are similar to the method described in pending European Patent Application 88.810613.5, filed on Sept. 12, 1988. The vertical etching and the 45° etching uses directional ion beam techniques by appropriately tilting the wafer relative to the ion-beam in a two-step process. The 45° deflecting surfaces are coated with a dielectric layer with high reflectivity whereby the front facet output power of the laser diodes is emitted upwardly, almost perpendicular to the surface of the wafer.

Typical dimensions of the structure of FIG. 5 are: the length of the laser structure 52 ranging from 300 to 1000 $\mu m$, those of the reflector structure 54 are not critical (unless used simultaneously for other purposes, such as beam monitoring). The lateral distance between the sources $Q_1$ and $Q_2$ is of the order of 20 $\mu m$ and equals the distance d between the mirror facet 53 and the reflecting points R1 and R2. The angles $\theta 1$ and $\theta 2$ between the reflecting surface planes 23.1 and 23.2 and the x-direction are derived from equation (3):

$$\tan \theta 1 = -\frac{\frac{1}{2}d}{d} \text{ and } \tan \theta 2 = +\frac{\frac{1}{2}d}{d}$$

The absolute value of the angles thus obtained is 26.5°.

While the present invention has been disclosed in connection with the preferred embodiment thereof, it should be understood that there may be other embodiments which fall within the spirit and scope of the invention as defined by the following claims.

What is claimed is:

1. A semiconductor laser diode arrangement comprising: an epitaxially grown layered structure on a semiconductor substrate with an array of laterally spaced ($S_n$) waveguides, each of said waveguides forming the source (Q1, Q2) of a laser beam (B1, B2) emitted in a direction substantially parallel to the surface of said semiconductor substrate, and individually oriented integrated reflectors (R1, R2) wherein each of said reflectors, one for each of said beams (B1, B2) are positioned in the beam paths so as to create an array of virtual sources (Q1', Q2') such that the lateral distance ($S_n'$) between said virtual sources (Q1', Q2') differs from said lateral distance ($S_n$) between corresponding said sources (Q1, Q2).

2. A semiconductor laser diode arrangement as in claim 1, further comprise an optical lens system for collecting reflected beams (B1', B2') and for forming an image of said virtual sources.

3. A semiconductor laser diode arrangement as in claim 1, wherein the light mode regions of said sources (Q1, Q2) are lined-up in a common mirror facet and wherein said virtual sources (Q1', Q2') are positioned on a straight line parallel to said lined-up light mode regions.

4. A semiconductor laser diode arrangement as in claim 3, wherein the distance between said mirror facet that terminates in said waveguides forming said sources ($Q1$, $Q2$) of said array and said reflectors ($R1$, $R2$) is the same for all source-reflector pairs.

5. A semiconductor laser diode arrangement as in claim 2, wherein said reflected beams ($B1'$, $B2'$) proceed in a direction that is essentially perpendicular to said substrate surface so as to provide a surface emitting device.

6. A semiconductor laser diode arrangement as in claim 1, wherein said distances ($S_n'$) between said virtual sources ($Q1'$, $Q2'$) are smaller than those between corresponding said sources ($Q1$, $Q2$).

7. An arrangement as in claim 6, wherein said virtual sources ($Q1'$, $Q2'$) coincide.

8. An arrangement as in claim 1, wherein an even number of said sources ($Q1$, $Q2$) is provided, and wherein each of said reflectors associated with said even number of sources forms an angle ($\theta 1$, $\theta 2$) with said mirror facets that terminate the waveguides of the array of said sources ($Q1$, $Q2$).

9. A method for fabricating an array of reflectors integrated with an array of lined-up laser diodes on a semiconductor substrate, the laser diodes emitting beams in a direction substantially parallel to the surface of said semiconductor substrate comprising the steps of:

providing a reflector structure from which tilted, individually oriented reflectors, one for each of said laser diode beams ($B_o$, $B_n$) are formed, applying an etch-mask on the top of said reflector structure, patterned to have individual segments, one of said segments for each of said reflectors, the positions and directions of which determine the positions and orientations of said reflectors, and etching said reflector structure using a unidirectional dry-etch process, to form said array of reflectors thereby providing for each said laser beam ($B_o$, $B_n$) an associated, individually oriented reflector deflecting said beam in a direction substantially perpendicular to the surface of said semiconductor substrate.

10. A method as in claim 9, wherein said individually oriented reflectors are positioned in the beam paths so as to create an array of virtual sources ($Q_o'$, $Q_n'$) positioned on a straight line parallel to the light mode regions of lined-up laser diodes.

11. A method as in claim 9, wherein the distance between said mirror facet that terminates the waveguides of all sources ($Q_o$, $Q_n$) of said array and said reflectors ($R_o$, $R_n$) is the same for all source-reflector pairs.

12. A method as in claim 9, wherein said distances ($S_n'$) between said virtual sources ($Q_o$, $Q_n$) are smaller than those between said corresponding sources ($Q_o$, $Q_n$) are smaller than those between corresponding said sources ($Q_o$, $Q_n$).

13. A method as in claim 12, wherein said virtual sources ($Q_o$, $Q_n$) coincide.

* * * * *

UNITED STATES PATENT AND TRADEMARK OFFICE
CERTIFICATE OF CORRECTION

PATENT NO. : 5,100,220

DATED : March 31, 1992

INVENTOR(S) : Otto Voegeli

It is certified that error appears in the above-identified patent and that said Letters Patent is hereby corrected as shown below:

In Column 2, Line 64, a portion of the paragraph is missing. The paragraph should read as follows:

"The group of reflectors, one for each beam that is desired, can be fabricated by a uni-directional dry-etch process using a mask whose segments (together with the common angle of the directional etch) properly determine the individual positions and the orientations of the tilted reflecting surfaces."

In Column 5, Line 29, a portion of the second sentence was left out. The second sentence should read as follows:

"Reference is made to FIG. 3 showing an arrangement similar to that of FIG. 2."

In Column 6, Lines 12, 19, and 22, the right arrows were omitted above the equations. These equations should read as follows:

Line 12 - $\vec{R}n = \vec{a} \times \vec{e}_n - \vec{Q}_n \vec{Q}_n{}'$

Line 19 - $\vec{a} = (0,-1,-1)$:

UNITED STATES PATENT AND TRADEMARK OFFICE
CERTIFICATE OF CORRECTION

PATENT NO. : 5,100,220

DATED : March 31, 1992

INVENTOR(S) : Otto Voegeli

It is certified that error appears in the above-identified patent and that said Letters Patent is hereby corrected as shown below:

<u>Column 6</u>

Line 22 - $\vec{a} \times \vec{e}_n = (0,-1,-1) \times (\cos \theta_n, \sin \theta_n, 0)$
$= (\sin \theta_n, -\cos \theta_n, \cos \theta_n)$ Signed and Sealed this Sixth Day of July, 1993

*Attest:*

MICHAEL K. KIRK

*Attesting Officer*     *Acting Commissioner of Patents and Trademarks*